United States Patent
Ogawa et al.

(10) Patent No.: US 6,762,445 B2
(45) Date of Patent: *Jul. 13, 2004

(54) DRAM MEMORY CELL WITH DUMMY LOWER ELECTRODE FOR CONNECTION BETWEEN UPPER ELECTRODE AND UPPER LAYER INTERCONNECT

(75) Inventors: Hisashi Ogawa, Katano (JP); Yoshihiro Mori, Neyagawa (JP); Akihiko Tsuzumitani, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

This patent is subject to a terminal disclaimer.

(21) Appl. No.: 10/196,270

(22) Filed: Jul. 17, 2002

(65) Prior Publication Data

US 2003/0015743 A1 Jan. 23, 2003

(30) Foreign Application Priority Data

Jul. 19, 2001 (JP) ........................................ 2001-219264

(51) Int. Cl.[7] ............................................ H01L 27/108
(52) U.S. Cl. ...................... 257/296; 257/303; 257/306; 257/307; 257/308; 257/352; 438/239; 438/244; 438/250; 438/253; 438/254; 438/393; 438/396; 438/397
(58) Field of Search ................................ 257/296, 303, 257/304, 306–308, 532; 438/239, 244, 250, 253, 254, 393, 396, 397

(56) References Cited

U.S. PATENT DOCUMENTS

2003/0015742 A1 * 1/2003 Ogawa et al. ............... 257/296
2003/0052350 A1 * 3/2003 Ohno ......................... 257/296

OTHER PUBLICATIONS

Japanese Patent Application Laid Open Gazette No. 10–256505 and an English abstract.
Japanese Patent Application Laid Open Gazette No. 8–222709 and an English abstract.
Japanese Patent Application Laid Open Gazette No. 5–326551 and an English abstract.
Japanese Patent Application Laid Open Gazette No. 8–008349 and an English abstract.
Japanese Patent Application Laid Open Gazette No. 2001–244435 and an English abstract.

* cited by examiner

Primary Examiner—David Nelms
Assistant Examiner—Long Tran
(74) Attorney, Agent, or Firm—McDermott, Will & Emery

(57) ABSTRACT

In a DRAM memory cell that is a semiconductor memory device, a bit line connected to a bit line plug and local interconnect are provided on a first interlayer insulating film. A contact is not provided on a Pt film constituting an upper electrode, and a dummy lower electrode is in direct contact with a dummy barrier metal. That is, the upper electrode is connected to upper layer interconnect (Cu interconnect) by the dummy lower electrode, a dummy cell plug and the local interconnect. Since the Pt film is not exposed to a reducing atmosphere, deterioration of characteristics of a capacitive insulating film can be prevented.

11 Claims, 11 Drawing Sheets

DRAM MEMORY CELL WITH DUMMY LOWER ELECTRODE FOR CONNECTION BETWEEN UPPER ELECTRODE AND UPPER LAYER INTERCONNECT

BACKGROUND OF THE INVENTION

The present invention relates to a semiconductor memory device and a method for fabricating the semiconductor memory device and, in particular, to a memory cell structure of a semiconductor memory device that uses a high-κ film or a ferroelectric film.

Recently, embedded-DRAM processes for combining DRAMs with high-performance logic circuits have been put into practical use in multimedia applications requiring large memory capacity and high data transmission speed.

However, since the conventional DRAM process requires high-temperature heating process for formation of a capacitive insulating film of a capacitor functioning as a memory capacitor, it has deficiencies such as worsening an impurity concentration profile of doped layers of a transistor in a high-performance logic circuit. In addition, it is also desirable to avoid the high-temperature heating process as far as possible in a memory single unit process for a DRAM, an FeRAM or the like in realizing miniaturization of a memory cell transistor.

Therefore, it has become indispensable to develop an MIM (metal-insulator-metal) capacitor in which a high-κ film that can be formed at a low temperature and is capable of making a memory size fine is used as the capacity dielectric film of a memory capacitor. As this high-κ film, there is a dielectric film having the perovskite structure such as a BST film ((BaSr)TiO$_3$ film). On the other hand, Pt that has high oxidation resistance is generally considered prospective as a material for forming a metal electrode of this MIM capacitor. In addition, dielectric films having the perovskite structure such as an SBT film (SrBi$_2$Ta$_2$O$_9$ film) and a BTO film (Bi$_4$Ti$_3$O$_{12}$ film) are often used as a ferroelectric film.

However, the conventional MIM capacitor functioning as a memory capacitor has the following problems.

First, when a contact hole is formed directly on a Pt electrode (upper electrode) provided on a capacitive insulating film, a reducing atmosphere or the like at the time when a contact plug is formed is likely to affect properties of the capacitor adversely. This is because oxygen deficiency occurs in a dielectric film due to the reducing atmosphere as, in general, a dielectric film is often an oxide. In particular, when the capacitive insulating film is a high-κ film or a ferroelectric film, the possibility of the occurrence of oxygen deficiency is high. Deterioration in the properties by oxygen deficiency occurs remarkably in a dielectric film having the perovskite structure.

In addition, in a device such as a DRAM in which a Pt electrode is not used, since it is difficult to share existing equipment in a step such as the formation of a contact in a Pt electrode, which is a new material, operation in dedicated equipment becomes necessary. For example, in such a time when a contact hole that reaches a Pt electrode is formed in an interlayer insulating film, since Pt is sputtered when the Pt electrode is exposed, Pt deposits on the wall surface of a chamber, members in the chamber, etc. If this chamber continues to be used, Pt enters an active region or the like of a transistor to affect transistor operations adversely.

SUMMARY OF THE INVENTION

The present invention has been devised in view of the above drawbacks, and it is an object of the present invention to provide a semiconductor memory device having good properties of an MIM capacitor and a method for fabricating the semiconductor memory device by taking measures for inhibiting deterioration of a dielectric film and, at the same time, preventing an electrode material from mixing in a transistor region.

In addition, it is another object of the present invention to provide a semiconductor memory device and a method for fabricating the semiconductor memory device that can reduce manufacturing costs by making dedicated equipment unnecessary.

A semiconductor memory device of the present invention comprises: a memory capacitor that is provided on an insulating layer on a semiconductor substrate and constituted by a lower electrode, an upper electrode and a capacitive insulating film interposed between the lower electrode and the upper electrode; an extension of the upper electrode from the upper electrode of the memory capacitor; a dummy conductor member that is provided such that at least a part of the dummy conductor member comes into contact with an underside of the extension of upper electrode; and upper layer interconnect that is electrically connected to the dummy conductor member.

Consequently, since the upper electrode is connected to the upper layer interconnect via the extension of upper electrode, a dummy lower electrode and the dummy conductor member, it is not unnecessary any more to form a contact hole above the upper electrode and a step in which the upper electrode is exposed to a reducing atmosphere becomes unnecessary. As a result, it becomes unlikely to cause oxygen deficiency in, for example, a capacitive insulating film consisting of BST and deterioration in the properties of the capacitive insulating film can be prevented. In addition, for example, if an electrode is formed of Pt, formation of the lower electrode, the dummy conductor member and the upper electrode is performed by dedicated equipment for Pt film formation. Thus, it becomes unlikely that equipment for the formation of logic circuit elements is contaminated.

The dummy conductor member may consist of a conductor film filling a trench provided in the insulating layer.

The dummy conductor member may further include local interconnect provided on the semiconductor substrate under the insulating layer and a plug that pierces through the insulating layer to electrically connect the extension of upper electrode and the local interconnect.

Since the local interconnect is further provided with a bit line formed below the memory capacitor across the insulating layer and is formed of a conductor film, which is the same as the bit line, a structure suitable for a memory with a capacitor over bit line utilizing the conductor film for the bit line is obtained.

Since at least a part of the extension of upper electrode overlaps the conductor plug when it is viewed two-dimensionally, the upper electrode and the upper layer interconnect are securely connected.

The semiconductor memory device further comprises: an isolating insulating film that is provided on the semiconductor substrate below the insulating layer; a memory cell transistor formed in a region of the semiconductor substrate, the memory cell transistor including a gate electrode and doped layers defined within the semiconductor substrate below the gate electrode to horizontally sandwich the gate electrode there between; local interconnect that is provided on the isolating insulating film and is formed of the same conductor film as the gate electrode; and a conductor plug that pierces through the insulating layer and is connected to the local interconnect. Therefore, a structure that can be applied to both a memory with a capacitor over bit line and a memory with a capacitor under bit line is obtained utilizing a conductor film (a polysilicon film, etc.) for the gate electrode.

The semiconductor memory device further comprises: a memory cell transistor that is provided on the semiconductor substrate and has a gate electrode and doped layers defined within the semiconductor substrate below the gate electrode to horizontally sandwich the gate electrode there between; local interconnect that is formed of another doped layer, which is provided separately from the doped layers on the semiconductor substrate; and a conductor plug that pierces through the insulating layer and is connected to the local interconnect. Therefore, a structure that can be applied to both a memory with a capacitor over bit line and a memory with a capacitor under bit line is obtained utilizing a step for forming source and drain regions.

Since the upper layer interconnect is in contact with the dummy lower electrode, a structure that can be applied to a memory with a capacitor over bit line and a memory with a capacitor under bit line is obtained with a relatively simple structure.

Since the memory capacitor has a clyndrical lower electrode, a capacitive insulating film and an upper electrode, a semiconductor memory device in which memory cells are arranged at a relatively high density is obtained.

The capacitive insulating film is preferably a high-κ film or a ferroelectric film.

A first method for fabricating a semiconductor memory device of the present invention is a method for fabricating a semiconductor memory device that comprises a memory capacitor that is constituted by a lower electrode, an upper electrode and a capacitive insulating film interposed between the lower electrode and the upper electrode, and upper layer interconnect that is electrically connected to the upper electrode of the memory capacitor, comprising: a step (a) of forming local interconnect on a semiconductor substrate; a step (b) of forming a first conductor film on the semiconductor substrate after the step (a); a step (c) of patterning the first conductor film to form at least the lower electrode; a step (d) of forming a dielectric film functioning as the capacitive insulating film covering the lower electrode; a step (e) of forming a second conductor film on the semiconductor substrate after the step (d); a step (f) of patterning the second conductor film to integrally form the upper electrode covering the entirety of the lower electrode and an extension of upper electrode that covers at least a part of the local interconnect and continues to the upper electrode; and a step (g) of forming the upper layer interconnect, which is electrically connected to the upper electrode, on the semiconductor substrate via at least the local interconnect and the extension of upper electrode after the step (f).

With this method, since it becomes possible to connect the upper electrode to the upper layer interconnect via the local interconnect and the extension of upper electrode, it is not necessary any more to provide a contact hole on the upper electrode in the manufacturing process as conventionally did, whereby the capacitive insulating film can be prevented from being reduced.

The method for fabricating the semiconductor memory device further comprises; a step (a2) of forming a first insulating film on the semiconductor substrate containing the local interconnect; and a step (a3) of forming a first conductor plug and a second conductor plug that pierce through the first insulating film and electrically connect to the local interconnect together, after the step (a) and before the step (b), wherein, in the step (f), the extension of upper electrode is formed to cover at least a part of the first conductor plug and, in the step (g), after forming a second insulating film on the semiconductor substrate, a trench for embedding interconnect that reaches the second conductor plug is formed in the second insulating film, and a conductive film is embedded in the trench to form the upper layer interconnect, whereby the semiconductor memory device of the present invention can be realized.

In the step (a), the local interconnect consists of the same conductor film as a bit line and is formed simultaneously with forming the bit line, whereby the semiconductor memory device of the present invention can be manufactured with fewer steps.

In the step (a), the local interconnect consists of the same conductor film as a gate electrode of a memory transistor and is formed simultaneously with forming the gate electrode, whereby the semiconductor memory device of the present invention can be manufactured in fewer steps.

In the step (a), the local interconnect consists of the same doped layers as source and drain regions of a memory transistor and may be formed simultaneously with forming the source and drain regions and separately from the source and drain regions.

In the step (a), even in the case in which the local interconnect is formed in a first insulating film formed on the semiconductor substrate simultaneously with forming a memory cell plug to be electrically connected to a source region of a memory cell transistor, the steps of manufacturing the semiconductor memory device of the present invention can be reduced.

The step (c) includes a step of forming a dummy lower electrode consisting of the first conductive film that separates from the lower electrode and covers at least a part of the local interconnect, and the local interconnect and the extension of upper electrode are electrically connected via the dummy lower electrode, whereby the semiconductor memory device of the present invention can be manufactured easily even in the case in which the dummy lower electrode is provided.

In the step (d), the dielectric film covering the lower electrode and the dummy lower electrode is formed, in the step (e), the second conductor film covering the dielectric film is formed, and after the step (f) and before the step (g), a step of pattering the dielectric film using the same etching mask as in forming the upper electrode and the extension of upper electrode to form a dielectric film for a capacitive insulating film, a step of etching at least a part positioned between the dummy lower electrode and the extension of upper electrode in the dielectric film for a capacitive insulating film to form the capacitive insulating film simultaneously with forming an inter-electrode space, and a step of causing the extension of upper electrode on the inter-electrode space to deform by heating process to cause the extension of upper electrode and the dummy lower electrode to come into contact with each other are further included, whereby an upper electrode and upper layer interconnect are electrically connected by the heating process between the step (f) and the step (g). Thus, the upper electrode is never exposed to the reducing atmosphere during the manufacturing process and deterioration of the capacitive insulating film can also be prevented.

After the step (a) and before the step (b), a step (a4) of forming a first insulating film on the semiconductor substrate containing the local interconnect and a step (a5) of forming a first conductor plug and a second conductor plug for piercing through the first insulating film to electrically connecting to the local interconnect together are further included, and after the step (a5), a step (a6) of forming an insulating film for step on the semiconductor substrate and a step (a7) of forming a first opening for forming the lower electrode of the memory capacitor and a second opening for forming a dummy lower electrode to be connected to the first conductor plug in the insulating film for step are further included. In the step (c), the lower electrode is formed on the side and the bottom of the first opening and the dummy lower electrode is formed on the side and the bottom of the second opening, in the step (f), the extension of upper electrode is formed so as to cover at least a part of the dummy lower electrode, and in the step (g), after forming a second insulating film on the semiconductor substrate, a trench for embedding interconnect that reaches the second conductor plug is formed in the second insulating film and the insulating film for step and a conductive film is embedded in the trench to form the upper layer interconnect, whereby, for example, upper layer interconnect and an upper electrode provided by a damascene method can be electrically connected.

The dielectric film is preferably a high-κ film or a ferroelectric film in realizing the semiconductor memory device.

DETAILED DESCRIPTION OF THE INVENTION

Embodiment 1

In this embodiment, a description will be given of an example in which the present invention is applied to a so-called DRAM memory cell structure with capacitor over bit line having a bit line provided in a position lower than a memory capacitor.

Figure 1A:
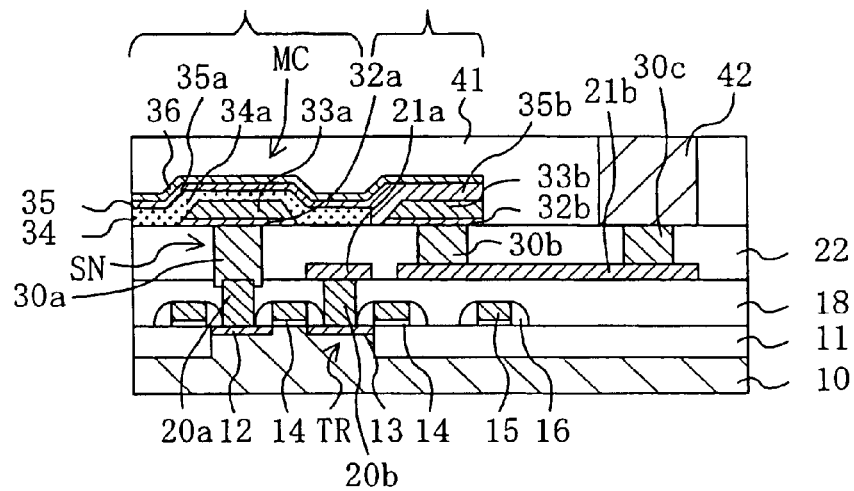
FIGS. 1A and 1B are a sectional view and a plan view showing a structure of a part of a memory portion and a structure of an upper electrode and a dummy electrode of a semiconductor memory device in a first embodiment of the present invention, respectively.
Figure 1B:
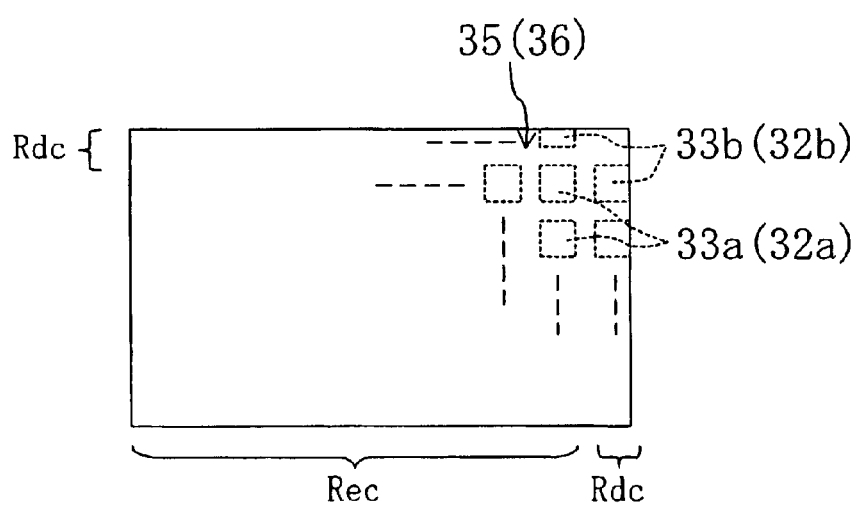
Figure 2A:
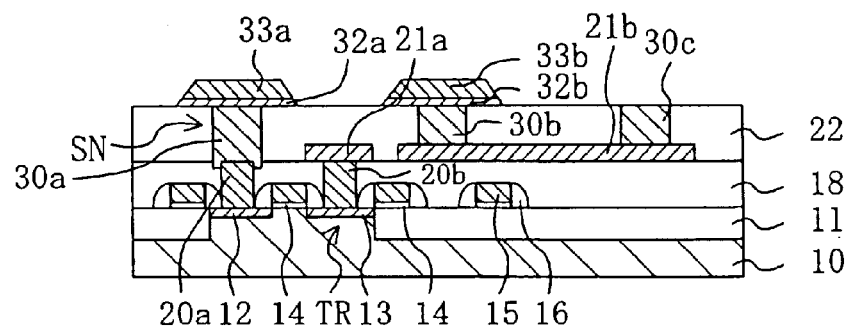
FIGS. 2A to 2C are step sectional views showing a manufacturing process of the semiconductor memory device in the first embodiment of the present invention.
Figure 2B:
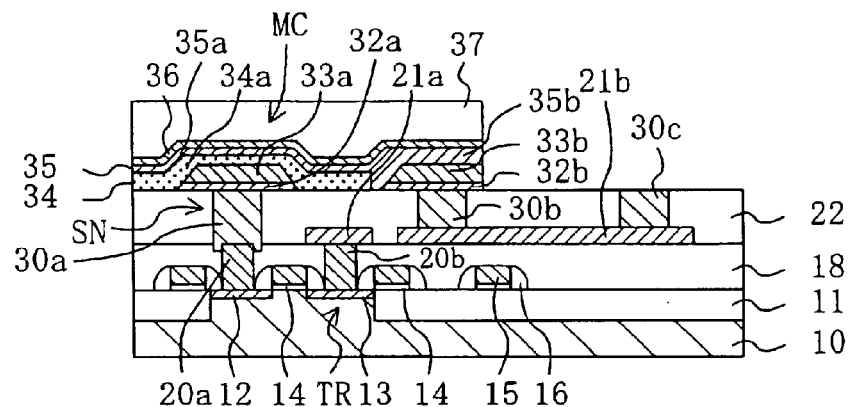
Figure 2C:
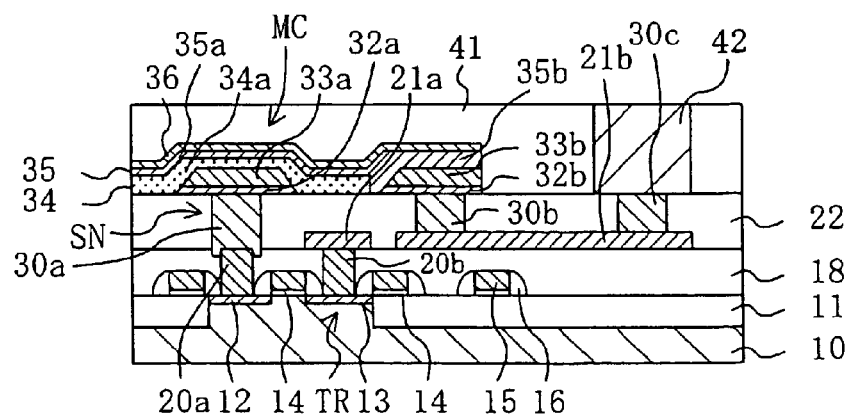

FIGS. 1A and 1B are a sectional view and a plan view showing a structure of a part of a memory portion and a structure of an upper electrode and a dummy electrode of a semiconductor memory device in a first embodiment of the present invention, respectively. In addition, FIGS. 2A to 2C are step sectional views showing a manufacturing process of the semiconductor memory device in this embodiment. A structure of the semiconductor memory device in this embodiment and a method for fabricating the semiconductor memory device will be hereinafter described below in order. In each figure of this embodiment, although only the structure of the memory portion is shown, the semiconductor memory device of this embodiment is a embedded device in which a logic circuit element is provided in a not-shown logic circuit portion. However, since a structure itself of the logic circuit element is not directly related to the essence of the present invention, it is not illustrated.

Structure of a Memory Cell

As shown in FIGS. 1A and 1B, in a memory cell of a DRAM functioning as the semiconductor memory device of this embodiment, an isolating insulating film 11 surrounding an active region and a source region 12 and a drain region 13, which are formed by introducing n-type impurities, are provided spaced apart from each other on an upper surface portion of a p-type Si substrate 10. Further, a portion of the p-type Si substrate 10 interposed between the source region 12 and the drain region 13 functions as a channel region. In addition, on the active region of the Si substrate 10, each gate insulating film 14 consisting of oxide silicon is provided between the source region 12 and the drain region 13, gate electrodes 15 (a part of a word line) consisting of polysilicon are provided on the gate insulating films 14, and oxide film side walls 16 are provided on the side surfaces of the gate electrodes 15. A memory cell transistor TR is constituted by the source region 12, the drain region 13, the channel region, the gate insulating films 14 and the gate electrodes 15. Further, in the section shown in FIG. 1A, the gate electrodes 15 that do not function as gates of the memory cell transistor TR are shown. However, in a section different from FIG. 1A, these gate electrodes 15 function as the gates of the memory cell transistor TR. Moreover, each gate electrode 15 extends in the direction almost perpendicular to the paper surface to be a word line of the DRAM.

In addition, a first interlayer insulating film 18 consisting of BPSG, which covers the isolating insulating film 11, the gate electrode 15 and the oxide film sidewall 16, are provided on the Si substrate 10. A lower layer memory cell plug 20a consisting of W (tungsten), which pierces through the first interlayer insulating film 18 to reach the source region 12, and a bit line plug 20b, which pierces through the first interlayer insulating film 18 to reach the drain region 13, are also provided on the Si substrate 10. Moreover, a bit line 21a consisting of a multilayer film of W/Ti, which is connected to the bit line plug 20b, and local interconnect 21b consisting of the same multilayer film of W/Ti as the bit line 2a are provided on the first interlayer insulating film 18. In addition, a second interlayer insulating film 22 consisting of, for example, NSG (non-doped $SiO_2$) is provided on the first interlayer insulating film 18. Further, an upper layer memory cell plug 30a, which pierces through the second interlayer insulating film 22 to reach the lower layer memory cell plug 20a, a dummy cell plug 30b, which pierces through the second interlayer insulating film 22 to reach the local interconnect 21b, and an interconnect plug 30c, which pierces through the second interlayer insulating film 22 to reach the local interconnect 21b are provided on the first interlayer insulating film 18.

In addition, a lower barrier metal 32a consisting of TiAlN is further provided on the upper layer memory cell plug 30a, and a dummy barrier metal 32b consisting of TiAlN is provided on the dummy cell plug 30b. Further, a lower electrode 33a consisting of Pt is formed on the lower barrier metal 32a and a dummy lower electrode 33b is formed on the dummy barrier metal 32b. Moreover, a BST film ((BaSr)TiO$_3$ film) 34, which covers the lower electrode 33a and parts of the second interlayer insulating film 22 on both sides of the lower electrode 33a, a Pt film 35, which covers from the BST film 34 to the dummy barrier metal 32b, and an upper barrier metal 36 consisting of TiAlN, which covers the Pt film 35, are provided on the upper layer memory cell plug 30a.

A portion of the BST film 34 in contact with the lower electrode 33a is a capacitive insulating film 34a. In addition, the portion of the Pt film 35 opposed to the lower electrode 33a is an upper electrode 35a, and a portion of the Pt film 35 in contact with the dummy lower electrode 33b is an extension of upper electrode 35b. A storage node SN of the DRAM memory cell is constituted by the lower barrier metal 32a and the lower electrode 33a. Further, a memory capacitor MC is constituted by the lower electrode 33a, the capacitive insulating film 34a and the upper electrode 35a.

Moreover, a third interlayer insulating film 41 consisting of FSG is provided on the second interlayer insulating film 22 and the upper barrier metal 36, and a Cu interconnect 42 in contact with the interconnect plug 30c is embedded in the third interlayer insulating film 41. That is, the upper electrode 35a is electrically connected to the Cu interconnect 42 via the extension of upper electrode 35b and dummy conductor members. Here, dummy conductor members mean the dummy barrier metal 32b, the dummy lower electrode 33b, the dummy cell plug 30b, the local interconnect 21b and the interconnect plug 30c, each consisting of a conductor.

In addition, in the structure shown in FIGS. 1A and 1B, an effective memory cell region Rec, which includes the memory capacitor MC, the storage node SN, the memory cell transistor TR and the like, and a dummy cell region Rdc, which includes the dummy lower electrode 33b, the extension of upper electrode 35b, the dummy cell plug 30b and the like come into existence.

This embodiment is characteristic in that a plug in contact with the upper electrode 35a or the extension of upper electrode 35 (upper barrier metal 36) is not provided and the upper electrode 35a is connected to the interconnect of the upper layer (Cu interconnect 42) by the dummy lower electrode 33b, the dummy barrier metal 32b, the dummy cell plug 30b and the local interconnect 21b.

In addition, as shown in FIG. 1B, the Pt film 35 (upper barrier metal 36) constituting the upper electrode 35a is shared by a large number of memory cells, and a large number of lower electrodes 33a (lower barrier metals 32a) and a dummy lower electrode 33b (dummy barrier metal 32b) are provided below the Pt film 35. Although a plurality of dummy lower electrodes 33b (dummy barrier metals 32b) are provided below the Pt film 35, the upper electrode 35a and the dummy lower electrode 33b are electrically connected to each other if at least one dummy lower electrode 33b is provided below at least a part of one of the end portions of the Pt film 35.

According to this embodiment, since a plug in contact with the Pt film 35 (upper barrier metal 36) constituting the upper electrode does not exist, it is unnecessary to form a contact hole for embedding a plug in the third interlayer insulating film 41. Therefore, in the dry etching (plasma etching) step for forming a contact hole in the upper electrode, the Pt film constituting the upper electrode is not exposed as it is in conventional structures. That is, if the Pt film is exposed to a reducing atmosphere in a state in which the Pt film is exposed, oxygen deficiency is likely to occur in the capacitive insulating film (in particular, high-κ film) consisting of BST or the like. Here, even if an upper barrier metal consisting of TiAlN is provided on a Pt film as in this embodiment, a function of preventing oxygen deficiency of the capacitive insulating film cannot be expected of the upper barrier metal when it is taken into account that the upper barrier metal is thin and the contact hole is highly likely to reach the upper electrode consisting of Pt because over etching is usually performed in etching the contact hole. In contrast to this, in this embodiment, since no contact hole is formed above the Pt film 35, the oxygen deficiency in the capacitive insulating film 34a, which is caused by the exposure of the Pt film to a reducing atmosphere, can be surely avoided.

In addition, since the Pt film 35 is not exposed in a step of forming a contact hole in the third interlayer insulating film 41, the etching for forming a contact hole can be performed within the same apparatus (chamber, etc.) as in the step of forming the logic circuit element. Further, since the formation itself of the lower electrode 33a, the dummy lower electrode 33b and the upper electrode 35a, which consist of Pt, is performed in equipment dedicated for Pt film formation, it is not essentially likely that an apparatus for forming the logic circuit element is contaminated.

Method for Fabricating a Memory Cell

Next, a manufacturing process of a memory cell of the semiconductor memory device in this embodiment will be described with reference to FIGS. 2A to 2C.

In a step shown in FIG. 2A, the following processing is performed. First, an isolating insulating film 11 surrounding an active region is formed in a p-type Si substrate 10, and a memory cell transistor consisting of a source region 12, a drain region 13, gate insulating films 14, gate electrodes 15 and oxide film sidewalls 16 is formed in the active region. This forming step of the memory cell transistor is performed with well-known procedures using a well-known technique such as thermal oxidation, forming and patterning of a polysilicon film and ion implantation.

Next, a BPSG film is deposited on the memory cell transistor and, thereafter, annealing and planarization by CMP (chemical mechanical polishing) is applied to the BSPS film to form a first interlayer insulating film 18. Moreover, contact holes that pierce through the first interlayer insulating film 18 to reach the source region 12 and the drain region 13, respectively, are formed. Next, n-type polysilicon films are formed in the contact holes and on the first interlayer insulating film 18 and, thereafter, planarization is applied to the n-type polysilicon films by CMP, whereby the polysilicon film is embedded in each contact hole to form a lower layer memory cell plug 20a and a bit line plug 20b.

Next, a W/Ti laminated film is deposited on the first interlayer insulating film 18 and, thereafter, the W/Ti laminated film is patterned by etching to form a bit line 21a connected to the bit line plug 20b and local interconnect 21b that is not connected to other members and isolated at this stage. In doing so, time when a surface of a Ti film is exposed is detected to judge ending time of etching of a W film when the W film is patterned. When the Ti film is patterned, etching is applied to the first memory cell plug 20a consisting of polysilicon in conditions with which a high selective ratio is realized.

Next, an NSG (non-doped silicate glass) film is deposited on the substrate and, thereafter, planarization by CMP (chemical mechanical polishing) is applied to the NSG film to form a second interlayer insulating film 22. Moreover, contact holes that pierce through the second interlayer insulating film 22 to reach the lower layer memory cell plug 20a and the local interconnect 21b (two parts), respectively, are formed. Next, W films are formed in the contact holes and, thereafter, planarization is applied to the W films by CMP, whereby the W film is embedded in each contact hole to form an upper layer memory cell plug 30a connected to the lower layer memory cell plug 20a and a dummy cell plug 30b and a interconnect plug 30c in contact with the local interconnect 21b, respectively, in two parts.

Next, a TiAlN film with a thickness of approximately 30 nm and a Pt film with a thickness of approximately 50 nm are sequentially deposited on the second interlayer insulating film 22. Then, the TiAlN film and the Pt film are patterned, whereby a lower barrier metal 32a connected to the memory cell plug 30a and a lower electrode 33a consisting of Pt above the lower barrier metal 32a as well as a dummy barrier metal 32b connected to the dummy cell plug 30b and a dummy lower electrode 33b above the dummy barrier metal 33b are formed on the second interlayer insulating film 22. Here, when the Pt film is patterned, etching is applied to the TiAlN film forming a base in conditions with which a high selective ratio is realized. When the TiAlN film is patterned, etching is applied to the upper layer memory cell plug 30a consisting of W forming a base in conditions with a high selective ratio such that the upper layer memory cell plug 30a does not sink.

Next, in a step shown in FIG. 2B, a BST film ((BaSr)TiO$_3$ film) with a thickness of approximately 30 nm covering the second interlayer insulating film 22, the lower electrode 33a and the dummy lower electrode 33b is formed and, thereafter, the BST film is patterned such that the dummy lower electrode 33b is exposed to form a BST film 34 that becomes a capacitive insulating film 34a covering the lower electrode 33a.

Next, a Pt film with a thickness of approximately 50 nm, a TiAlN film with a thickness of approximately 6 nm and an SiO$_2$ film are sequentially deposited on the BST film 34 and the dummy lower electrode 33b. Then, the SiO$_2$ film is patterned to form a hard mask 37 and, thereafter, the TiAlN film and the Pt film are sequentially patterned by dry etching using the hard mask 37 to form an upper barrier metal 36 covering an effective memory cell region Rec and a dummy cell region Rdc and a Pt film 35 including an upper electrode 35a and an extension of upper electrode 35b.

Next, in a step shown in FIG. 2C, the hard mask 37 is removed by wet etching using dilute hydrofluoric acid liquid and, thereafter, a TEOS film is deposited on the substrate and planarized by CMP to form a third interlayer insulating film 41. Next, a trench reaching the interconnect plug 30c is formed in the third interlayer insulating film 41 and, thereafter, embedding (damascene method) or the like of a Cu interconnect 42 in the trench is performed, whereby a sectional structure of the memory cell shown in FIG. 1A is obtained.

According to the manufacturing method in this embodiment, the step of forming a contact hole that pierces through the third interlayer insulating film 41 to reach the upper surface of the Pt film 35 (upper barrier metal 36) can be avoided without increasing a photolithography step in a conventional process. That is, in such a case in which a trench for embedding interconnect is formed in the third interlayer insulating film 41, in general, annealing in a reducing atmosphere is often used in the forming step of the Cu interconnect. Therefore, when the contact hole is formed on the upper barrier metal 36, since hydrogen is in contact with the Pt film 35 through the thin upper barrier metal 36 or directly if the Pt film 35 is exposed by over etching, the hydrogen may pass through the Pt film 35 to reach the BST film 34. In this case, oxygen in the BST film 34 is lost and oxygen deficiency occurs. In such a way, deterioration of characteristics of the capacitive insulating film 34a is likely to be caused. In contrast to this, as in this embodiment, the step of forming a contact hole reaching the upper surface of the Pt film 35 is avoided, whereby deterioration of the characteristics of the capacitive insulating film 34a due to such a cause can be surely inhibited. Then, since the step of forming the Cu interconnect 42 corresponds to the conventional process of forming a plug on an upper electrode and the formation of the local interconnect 21b and the interconnect plug 30c can be performed utilizing the step of forming the memory cell, the photolithography step is not added to the conventional process, that is, the process of directly providing the plug on the Pt film (upper barrier metal).

Further, although the upper electrode 35a and the lower electrode 33a are formed of Pt and the upper barrier metal 36 is formed of TiAlN in this embodiment, these members may be formed of other conductive materials having oxidation resistance. In addition, the capacitive insulating film 34a is formed of BST, it may be formed of other high dielectric materials. In particular, in the case of a dielectric film having the perovskite structure represented by a constitutional formula ABO$_3$, since oxygen atoms tend to be lost by reduction, a significant effect is realized by applying the present invention.

In addition, it is needless to mention that the present invention is not limited to a embedded device such as this embodiment but can be also applied to a semiconductor memory device having a capacitor using a general-purpose DRAM or a metal electrode such as an FeRAM.

Embodiment 2

FIGS. 3A to 3D are sectional views showing a method for fabricating a semiconductor memory device in a second embodiment of the present invention. The method of this embodiment is another method for fabricating the semiconductor memory device of the first embodiment shown in FIG. 1A.

Figure 3A:
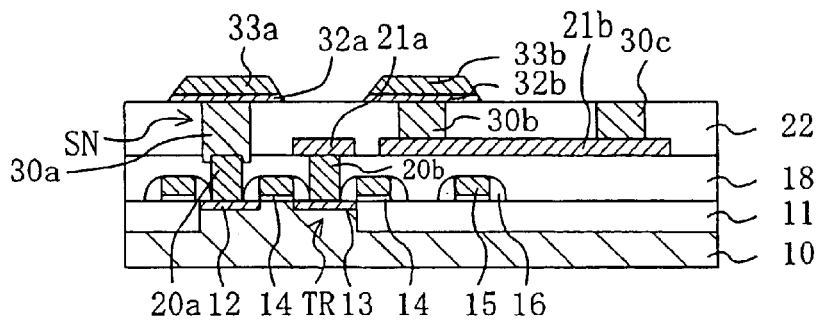
FIGS. 3A to 3D are step sectional views showing a manufacturing process of a semiconductor memory device in a second embodiment of the present invention.

In a step shown in FIG. 3A, processing is performed up to the formation of the lower electrode 33a and the dummy lower electrode 33b by the same procedures as the first embodiment.

Figure 3B:
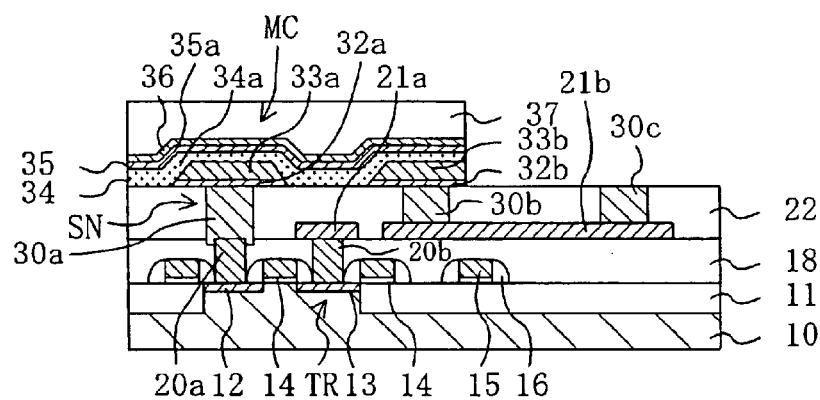

Next, in a step shown in FIG. 3B, a BST film ((BaSr)TiO$_3$ film) with a thickness of approximately 30 nm covering the second interlayer insulating film 22, the lower electrode 33a and the dummy lower electrode 33b, a Pt film with a thickness of approximately 50 nm, a TiAlN film with a thickness of approximately 6 nm and an SiO$_2$ film are sequentially deposited. Then, the SiO$_2$ film is patterned to form the hard mask 37 and, thereafter, the TiAlN film, the Pt film and the BST film are sequentially patterned by dry etching using the hard mask 37 to form the upper barrier metal 36 covering the effective memory cell region Rec and the dummy cell region Rdc, the Pt film 35 including the upper electrode 35a and the extension of upper electrode 35b and the BST film 34 are formed, respectively.

Figure 3C:
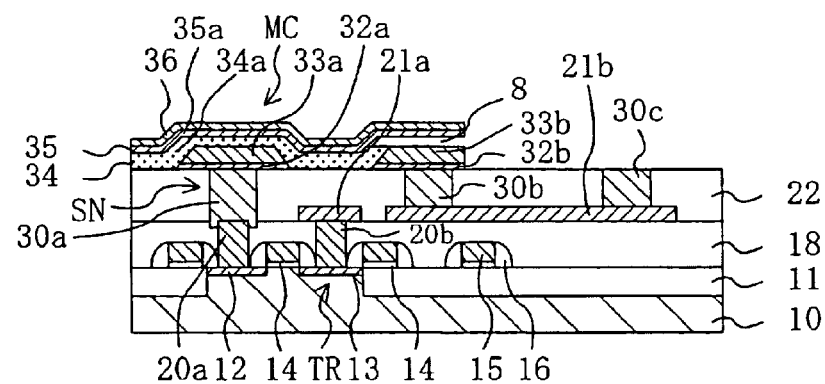

Next, in a step shown in FIG. 3C, the hard mask 37 is removed by wet etching by dilute hydrofluoric acid liquid. At this point, since BST is also dissolved by the dilute hydrofluoric acid liquid, the upper part of the dummy barrier metal 32b in the BST film 34 is also removed. In this way, an inter-electrode space 8 is formed.

Figure 3D:
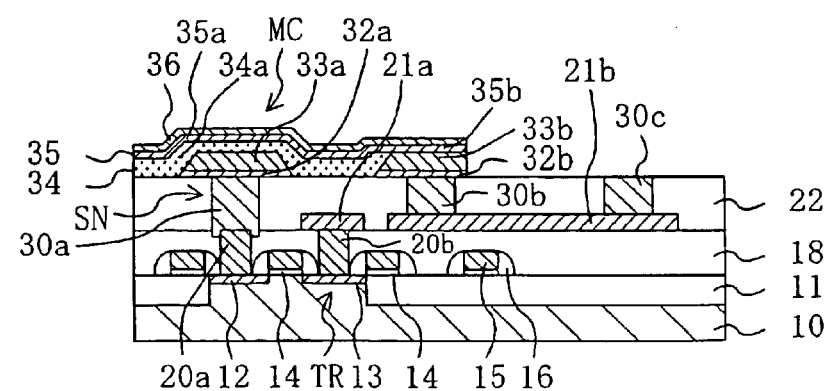

Subsequently, in a step shown in FIG. 3D, for example, heating process of the substrate is performed for one minute at 500° C. in the oxygen atmosphere, whereby the extension of upper electrode 35b positioned above the inter-electrode space 8 is deformed to bring the dummy lower electrode 33b and the extension of upper electrode 35b into contact with each other. Since platinum has higher liquidity when it is heated, it can be easily deformed. At this point, contact of the dummy lower electrode 33b and the extension of upper electrode 35b may be secured by applying a pressure to the substrate.

Thereafter, although not shown in the figure, a fourth interlayer insulating film 41 and Cu interconnect 42 are formed as in the first embodiment.

According to the manufacturing method of this embodiment, the photolithography step in patterning the BST film 34 (note: since the BST film is denoted by reference numeral 34 and the capacitive insulating film is denoted by 34a throughout the specification, this is not denoted by "34a" but denoted by "34") becomes unnecessary. At the same time, since the BST film is etched simultaneously with the removal of the hard mask 37, the number of manufacturing steps can be reduced compared with the first embodiment, and the semiconductor memory device can be manufactured easily. In addition, since a plug is not formed on the upper electrode, the BST film 34 that becomes the capacitive insulating film 34a is not exposed to the reducing atmosphere any more and deterioration of a film quality of the BST film 34 can be prevented as in the first embodiment.

Further, although the upper electrode 35a and the lower electrode 33a are formed of Pt and the upper barrier metal 36 is formed of TiAlN in this embodiment, these members may be formed of other conductive materials having oxidation resistance. In addition, although the capacitive insulating film 34a is formed of BST in this embodiment, it may be formed of other high dielectric materials. In particular, in the case of a dielectric film having the perovskite structure represented by a constitutional formula $ABO_3$, since oxygen atoms tend to be lost by reduction, a significant effect is realized by applying the present invention.

In addition, it is needless to mention that the present invention is not limited to a embedded device such as this embodiment but can be also applied to a semiconductor memory device having a capacitor using a general-purpose DRAM or a metal electrode such as an FeRAM.

Embodiment 3

As a third embodiment of the present invention, the semiconductor memory device of the first embodiment without the dummy lower electrode 33b and the dummy barrier metal 32b formed therein will be described.

Figure 4:
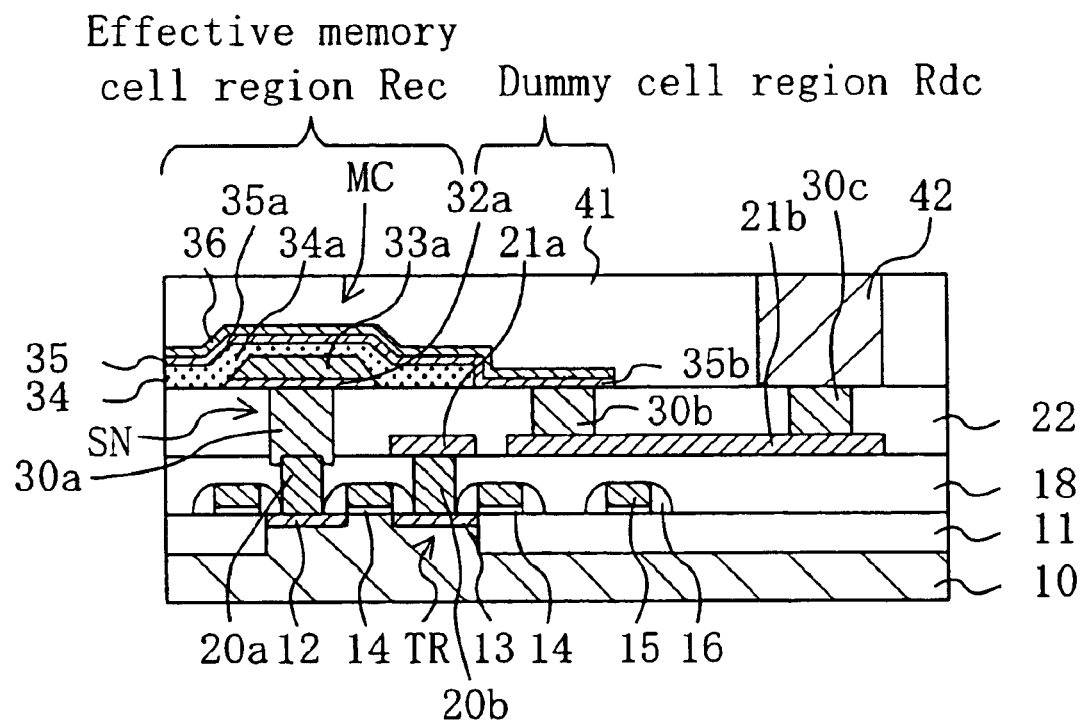
FIG. 4 is a sectional view showing a semiconductor memory device in accordance with a third embodiment of the present invention.

FIG. 4 is a sectional view showing a semiconductor memory device of this embodiment. Further, the same members as in FIG. 1A are denoted by the identical reference numerals.

As shown in FIG. 4, the semiconductor memory device of this embodiment is provided with the memory cell transistor TR having the Si substrate 10 and the source region 12, the drain region 13, the channel region, the gate insulating films 14 and the gate electrodes 15 provided on the Si substrate 10, and a dielectric capacitor connected to the source region 12 of the memory cell transistor TR by the upper layer memory cell plug 30a. This dielectric capacitor has the lower barrier metal 32a provided on the upper layer memory cell plug 30a and the lower electrode 33a, the BST film 34, the Pt film 35 and the upper barrier metal 36 provided in order on the lower barrier metal 32a. A part of the Pt film 35 opposed to the lower electrode 33a is used as the upper electrode 35a, and a part of the BST film 34 between the lower electrode 33a and the upper electrode 35a is used as the capacitive insulating film 34a.

In addition, the Pt film 35 and the upper barrier metal 36 extend to the side of the lower electrode 33a, and a part extending to the upper surface of the second interlayer insulating film 22 is used as the extension of upper electrode 35b. The local interconnect 21b is provided on the first interlayer insulating film 18 provided on the memory cell transistor TR, and the Cu interconnect 42 is provided piercing through the third interlayer insulating film 41 provided on the second interlayer insulating film 22. Then, the extension of upper electrode 35b and the local interconnect 21b are mutually connected by the dummy cell plug 30b, and the local interconnect 21b and the Cu interconnect 42 are mutually connected by the interconnect plug 30c. That is, the upper electrode 35a is electrically connected to the Cu interconnect 42 via the extension of upper electrode 35b and dummy conductor members. Here, the dummy conductor members mean the dummy cell plug 30b, the local interconnect 21b and the interconnect plug 30c, each consisting of a conductor.

A plug in contact with the Pt film 35 can be eliminated even if a dummy lower electrode or a dummy barrier metal is not provided as in the semiconductor memory device of this embodiment, oxygen deficiency of the capacitive insulating film 34a due to exposure of the Pt film to the reducing atmosphere can be surely avoided while securing the connection between the upper electrode 35a and the Cu interconnect 42.

In addition, in a step of forming a contact hole in the third interlayer insulating film 41, since the Pt film 35 is never exposed, etching for forming the contact hole can be performed in the same apparatus (chamber, etc.) as in a process for forming a logic circuit element. Further, since the formation itself of the lower electrode 33a and the upper electrode 35a consisting of Pt is performed by equipment dedicated for Pt film formation, it is also not essentially likely in the semiconductor memory device of this embodiment that an apparatus for forming the logic circuit element is contaminated.

Next, a manufacturing process of a memory cell of the semiconductor memory device in this embodiment will be described.

Figure 5A:
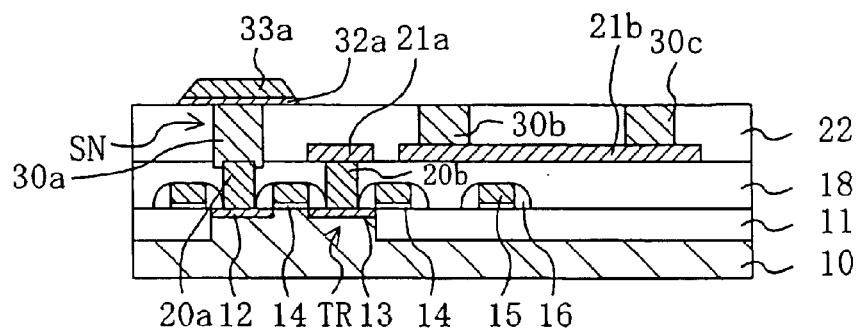
FIGS. 5A to 5C are step sectional views showing a manufacturing method of the semiconductor memory device in accordance with the third embodiment.
Figure 5B:
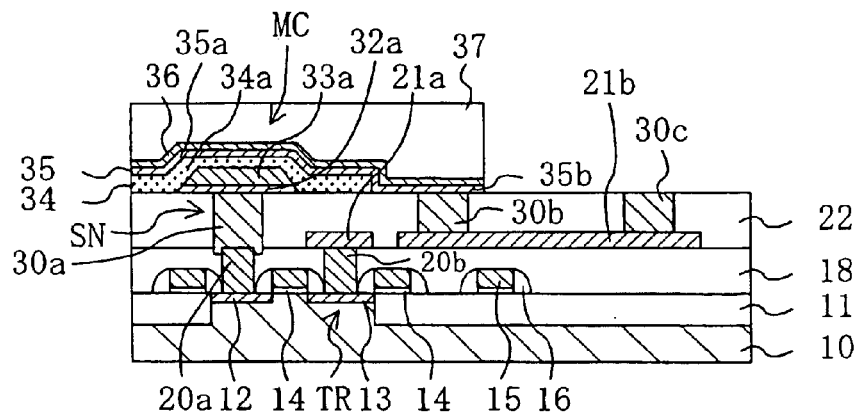
Figure 5C:
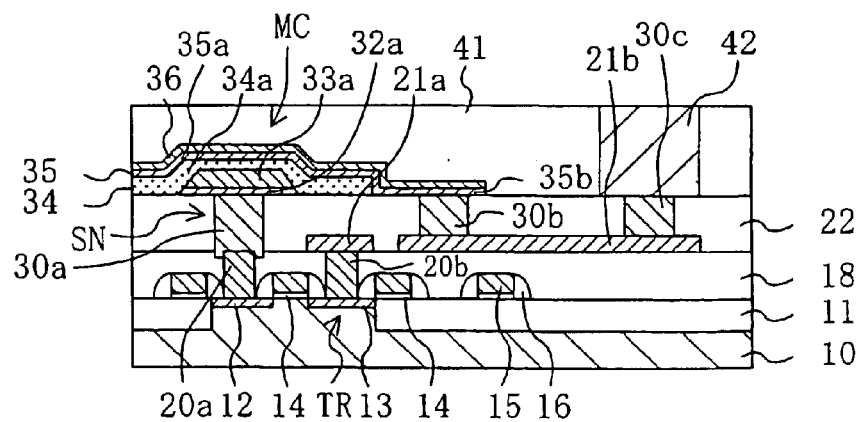

FIGS. 5A to 5C are sectional views showing a method for fabricating the semiconductor memory device of this embodiment.

In a step shown in FIG. 5A, the following processing is performed. First, the isolating insulating film 11 surrounding the active region is formed in the p-type Si substrate 10, and the memory cell transistor consisting of the source region 12, the drain region 13, the gate insulating films 14, the gate electrodes 15 and the oxide film sidewalls 16 is formed in the active region. This forming step of the memory cell transistor is performed with well-known procedures using a well-known technique such as thermal oxidation, forming and patterning of a polysilicon film and ion implantation.

Next, a BPSG film is deposited on the memory cell transistor and, thereafter, annealing and planarization by CMP (chemical mechanical polishing) is applied to the BSPS film to form the first interlayer insulating film 18. Moreover, contact holes that pierce through the first interlayer insulating film 18 to reach the source region 12 and the drain region 13, respectively, are formed. Next, n-type polysilicon films are formed in the contact holes and on the first interlayer insulating film 18 and, thereafter, planarization is applied to the n-type polysilicon films by CMP, whereby the polysilicon film is embedded in each contact hole to form the lower layer memory cell plug 20a and the bit line plug 20b.

Next, a W/Ti laminated film is deposited on the first interlayer insulating film 18 and, thereafter, the W/Ti laminated film is patterned by etching to form the bit line 21a connected to the bit line plug 20b and the local interconnect 21b. In doing so, time when a surface of a Ti film is exposed is detected to judge ending time of etching of a W film when the W film is patterned. When the Ti film is patterned, etching is applied to the first memory cell plug 20a consisting of polysilicon in conditions with which a high selective ratio is realized.

Next, an NSG film is deposited on the substrate and, thereafter, planarization by CMP (chemical mechanical polishing) is applied to the NSG film to form the second interlayer insulating film 22. Moreover, contact holes that pierce through the second interlayer insulating film 22 to reach the lower layer memory cell plug 20a and the local interconnect 21b (two parts), respectively, are formed. Next, W films are formed in the contact holes and, thereafter, planarization is applied to the W films by CMP, whereby the W film is embedded in each contact hole to form the upper layer memory cell plug 30a connected to the lower layer memory cell plug 20a, and the dummy cell plug 30b and the interconnect plug 30c in contact with the local interconnect 21b, respectively, in two parts.

Next, a TiAlN film with a thickness of approximately 30 nm and a Pt film with a thickness of approximately 50 nm are sequentially deposited on the second interlayer insulating film 22. Then, the TiAlN film and the Pt film are patterned, whereby the lower barrier metal 32a connected to the memory cell plug 30a and the lower electrode 33a consisting of Pt above the lower barrier metal 32a are formed on the second interlayer insulating film 22. Here, when the Pt film is patterned, etching is applied to the TiAlN film forming a base in conditions with which a high selective ratio is realized. When the TiAlN film is patterned, etching is applied to the upper layer memory cell plug 30a consisting of W forming a base in conditions with a high selective ratio such that the upper layer memory cell plug 30a does not sink.

Next, in a step shown in FIG. 5B, a BST film ((BaSr)TiO$_3$ film) with a thickness of approximately 30 nm covering the second interlayer insulating film 22 and the lower electrode 33a is formed and, thereafter, the BST film is patterned such that the second interlayer insulating film 22 is exposed to form the BST film 34 that becomes the capacitive insulating film 34a covering the lower electrode 33a.

Subsequently, a Pt film with a thickness of approximately 50 nm, a TiAlN film with a thickness of approximately 6 nm and an SiO$_2$ film are sequentially deposited on the BST film 34, the second interlayer insulating film 22 and the dummy cell plug 30b. Then, the SiO$_2$ film is patterned to form a hard mask 37 and, thereafter, the TiAlN film and the Pt film are sequentially patterned by dry etching using the hard mask 37 to form the upper barrier metal 36 covering the effective memory cell region Rec and the dummy cell region Rdc and the Pt film 35 including the upper electrode 35a and the extension of upper electrode 35b.

Next, in a step shown in FIG. 5C, the hard mask 37 is removed by wet etching using dilute hydrofluoric acid liquid and, thereafter, a TEOS film is deposited on the substrate and planarized by CMP to form the third interlayer insulating film 41. Next, a trench is formed on the third interlayer insulating film 41 and, thereafter, embedding (damascene method) or the like of the Cu interconnect 42 in the trench is performed, the semiconductor memory device of this embodiment is obtained. Further, in the step shown in FIG. 5B, the extension of upper electrode 35a and the upper barrier metal 36 are not required to completely overlap the dummy cell plug 30b. It is sufficient if the extension of upper electrode 35a and the upper barrier metal 36 are formed such that a part of them overlaps the dummy cell plug 30b.

Further, the case in which the semiconductor memory device in accordance with the first embodiment is not provided with the dummy barrier metal 32b and the dummy lower electrode 33b is described in this embodiment. However, it does not matter if the dummy barrier metal 32b and the dummy lower electrode 33b are not formed in semiconductor memories in accordance with the following embodiments.

Embodiment 4

Figure 6:
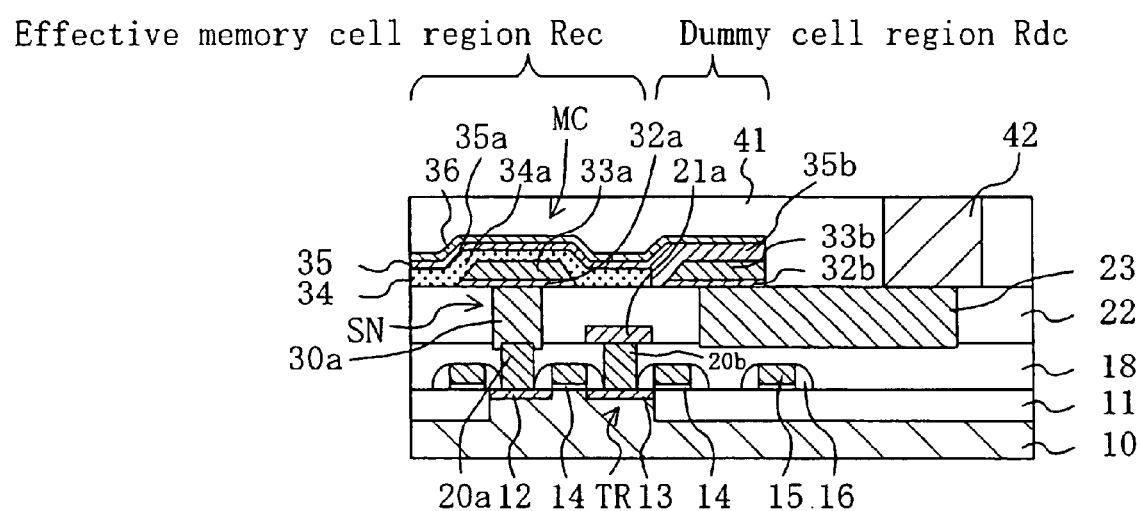
FIG. 6 is a sectional view showing a structure of a part of a memory portion of a semiconductor memory device in a fourth embodiment of the present invention.

FIG. 6 is a sectional view showing a structure of a part of a memory portion in the semiconductor memory device in the fourth embodiment of the present invention.

As shown in the figure, the structure of the memory portion of this embodiment is different from the first embodiment in that the local interconnect 21b, the dummy cell plug 30b and the dummy lower electrode 33b, which consist of W/Ti films, in the first embodiment are not provided, and local interconnect 23 consisting of W filling the trench formed in the second interlayer insulating film 22 is provided. This local interconnect 23 is formed simultaneously with forming the upper layer memory cell plug 30a. The other members are the same as the members shown in FIG. 1A, and these members are denoted by the same reference symbols as in FIG. 1A.

According to this embodiment, the upper electrode 35a and the Cu interconnect 42 are electrically connected via the local interconnect 23, the dummy barrier metal 32b and the dummy lower electrode 33b, which consist of W. In addition, in this embodiment, it is also unnecessary to form a contact hole, which reaches the Pt film 35 (upper barrier metal 36) constituting the upper electrode 35a, in the third interlayer insulating film 41. Thus, an effect of preventing deterioration of characteristics of the capacitive insulating film 34a, an effect of making dedicated equipment for memory cell formation unnecessary, and the like, can be realized by this embodiment as in the first embodiment.

Embodiment 5

Figure 7:
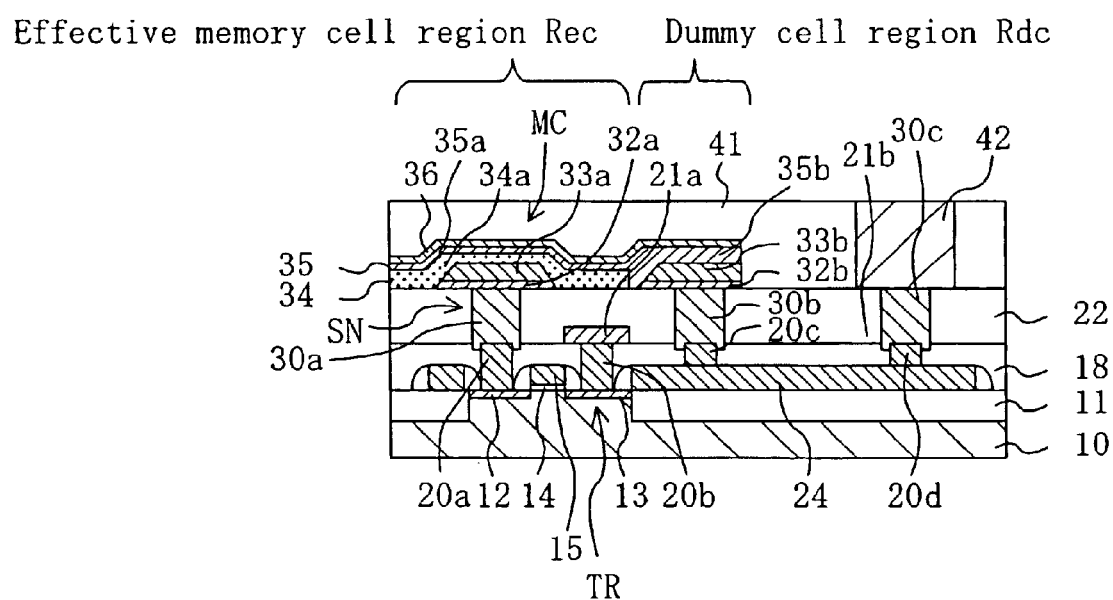
FIG. 7 is a sectional view showing a structure of a part of a memory portion of a semiconductor memory device in a fifth embodiment of the present invention.

FIG. 7 is a sectional view showing a structure of a part of a memory portion in the semiconductor memory device in the fifth embodiment of the present invention.

As shown in the figure, the structure of the memory portion of this embodiment is different from the first embodiment in that local interconnect 24 consisting of polysilicon is provided on the isolating insulating film 11 instead of the local interconnect 21b consisting of a W/Ti film in the first embodiment and, moreover, a lower layer dummy cell plug 20c piercing through the first interlayer insulating film 18 to come into contact with the local interconnect 24 and a lower layer interconnect plug 20d piercing through the first interlayer insulating film 18 to come into contact with the local interconnect 24 are provided. In addition, in this embodiment, the dummy cell plug 30b and the interconnect plug 30c are connected to the lower layer dummy cell plug 20c and the lower layer interconnect plug 20d, respectively. The local interconnect 24 is formed simultaneously with forming the gate electrode 15. The other members are the same as the members shown in FIG. 1A, and these members are denoted by the same reference numerals as in FIG. 1A.

According to this embodiment, the upper electrode 35a and the Cu interconnect 42 are electrically connected via the dummy lower electrode 33b, the dummy barrier metal 32b, the dummy cell plug 30b, the lower layer dummy cell plug 20c, the local interconnect 24, the lower layer interconnect plug 20d and the interconnect plug 30c. In addition, in this embodiment, it is also unnecessary to form a contact hole, which reaches the Pt film 35 (upper barrier metal 36) constituting the upper electrode 35a, in the third interlayer insulating film 41. Thus, an effect of preventing deterioration of characteristics of the capacitive insulating film 34a, an effect of making dedicated equipment for memory cell formation unnecessary, and the like, can be realized by this embodiment as in the first embodiment.

Embodiment 6

Figure 8:
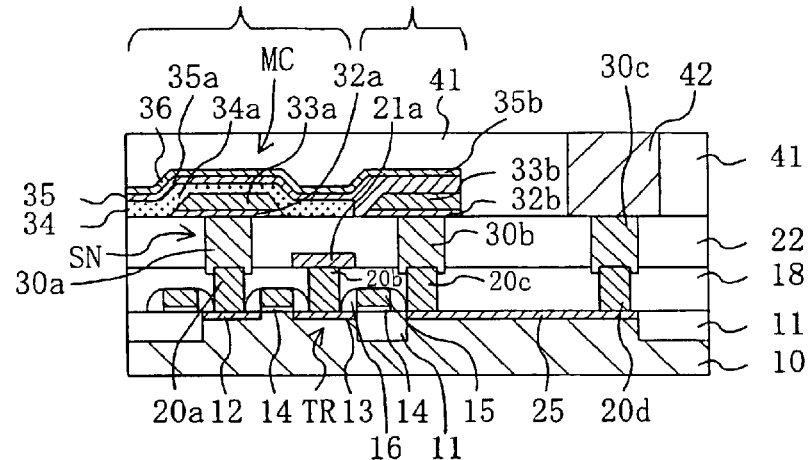
FIG. 8 is a sectional view showing a structure of a part of a memory portion of a semiconductor memory device in a sixth embodiment of the present invention.

FIG. 8 is a sectional view showing a structure of a part of a memory portion in the semiconductor memory device in the sixth embodiment of the present invention.

As shown in the figure, the structure of the memory portion of this embodiment is different from the first embodiment in that local interconnect 25 consisting of doped layers is provided in the Si substrate 10 instead of the local interconnect 21b consisting of a W/Ti film in the first embodiment and, moreover, the lower layer dummy cell plug 20c piercing through the first interlayer insulating film 18 to come into contact with the local interconnect 25 and the lower layer interconnect plug 20d piercing through the first interlayer insulating film 18 to come into contact with the local interconnect 25 are provided. In addition, in this embodiment, the dummy cell plug 30b and the interconnect plug 30c are connected to the lower layer dummy cell plug 20c and the lower layer interconnect plug 20d, respectively. The local interconnect 25 is formed simultaneously with forming the source and drain regions 12 and 13. The other members are the same as the members shown in FIG. 1A, and these members are denoted by the same reference numerals as in FIG. 1A.

According to this embodiment, the upper electrode 35a and the Cu interconnect 42 are electrically connected via the dummy lower electrode 33b, the dummy barrier metal 32b, the dummy cell plug 30b, the lower layer dummy cell plug 20c, the local interconnect 25, the lower layer interconnect plug 20d and the interconnect plug 30c. In addition, in this embodiment, it is also unnecessary to form a contact hole, which reaches the Pt film 35 (upper barrier metal 36) constituting the upper electrode 35a, in the third interlayer insulating film 41. Thus, an effect of preventing deterioration of characteristics of the capacitive insulating film 34a, an effect of making dedicated equipment for memory cell formation unnecessary, and the like, can be realized by this embodiment as in the first embodiment.

Embodiment 7

Figure 9:
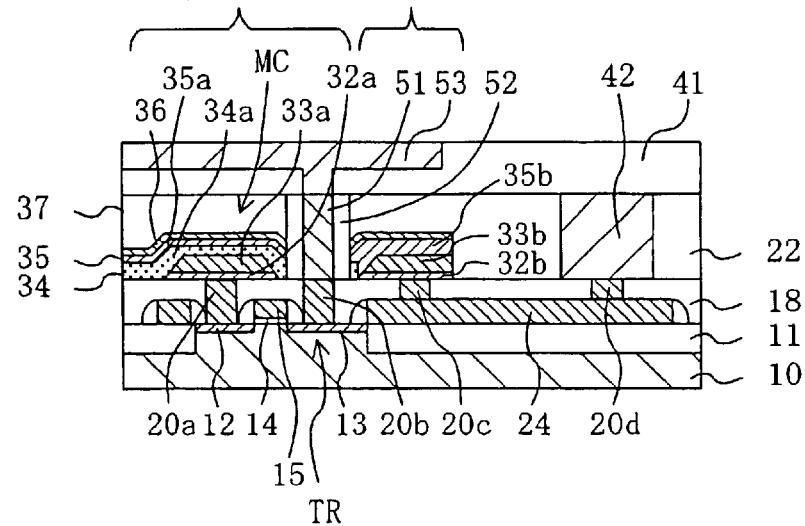
FIG. 9 is a sectional view showing a structure of a part of a memory portion of a semiconductor memory device in a seventh embodiment of the present invention.
Figure 10A:
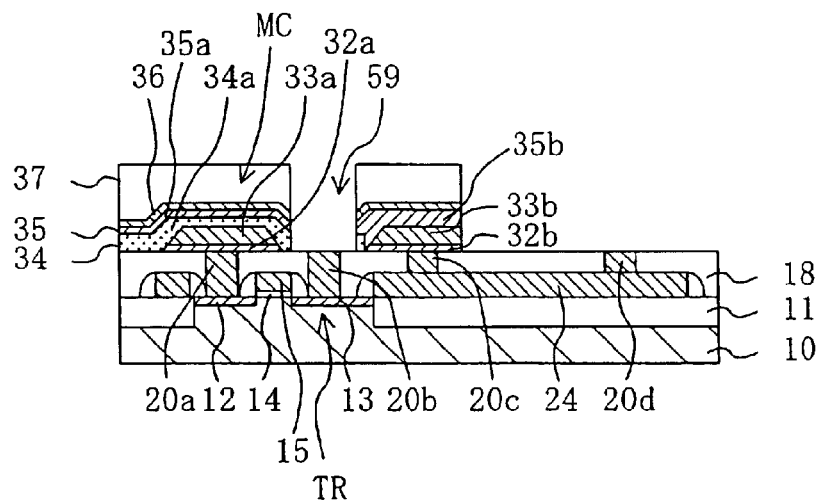
FIGS. 10A to 10C are step sectional views showing a manufacturing process of the semiconductor memory device in the seventh embodiment of the present invention.
Figure 10B:
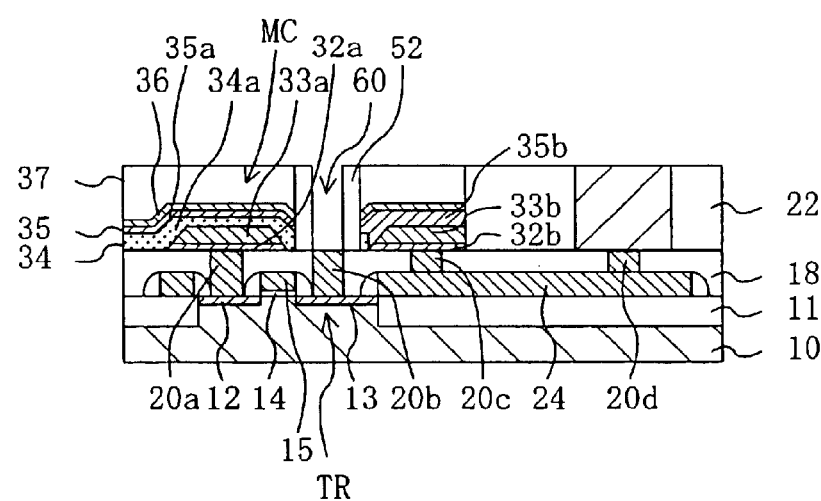
Figure 10C:
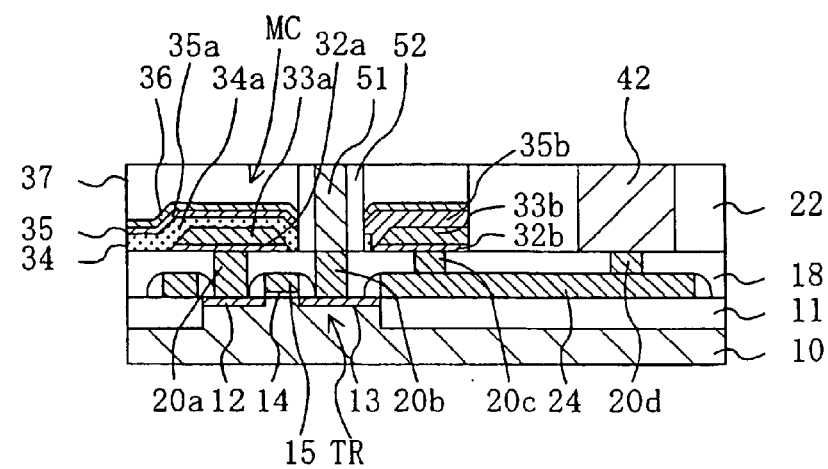

In the first to sixth embodiments, the examples in which the present invention is applied to the DRAM memory cell structure with a capacitor over bit line are described. In this embodiment, an example in which the present invention is applied to a DRAM memory cell structure with a bit line arranged in an upper position, in which a bit line is arranged in a position higher than a memory capacitor, will be described. FIG. 9 is a sectional view showing a structure of a part of a memory portion in a semiconductor memory device in the seventh embodiment. FIGS. 10A to 10C are sectional views showing a manufacturing process of the semiconductor memory device in the seventh embodiment. The structure of the semiconductor memory device in this embodiment and the method for fabricating the semiconductor memory device will be hereinafter described in order. Here, although only the structure of the memory portion is shown in each figure of this embodiment, the semiconductor memory device of this embodiment is a embedded device in which a logic circuit element is provided in a not-shown logic circuit portion as in the first embodiment. However, a structure itself of the logic circuit element is not shown in the figures because it is not directly related to the essence of the present invention.

As shown in FIG. 9, in the memory portion of this embodiment, as in the fifth embodiment, the local interconnect 24 consisting of polysilicon is provided on the isolating insulating film 11 instead of the local interconnect 21b consisting of a W/Ti film in the first embodiment and, moreover, the lower layer dummy cell plug 20c piercing through the first interlayer insulating film 18 to come into contact with the local interconnect 24 and the lower layer interconnect plug 20d piercing through the first interlayer insulating film 18 to come into contact with the local interconnect 24 are provided.

In addition, in this embodiment, a memory capacitor MC and a dummy cell are provided on the first interlayer insulating film 18, and the dummy lower electrode 33b (dummy barrier metal 32b) and the Cu interconnect 42 are directly connected to the lower layer dummy cell plug 20c and the lower layer interconnect plug 20d, respectively. The local interconnect 24 is formed of the same polysilicon film as the gate electrode 15.

Moreover, on the bit line plug 20b, an upper layer bit line plug 51 piercing through the second interlayer insulating film 22 to reach the bit line plug 20b, an insulator film 52 covering the sides of the upper layer bit line plug 51 and a bit line 53 consisting of a Cu film embedded in the third interlayer insulating film 41 are provided. That is, the memory portion is provided with a structure of the DRAM memory cell with a bit line arranged in an upper position, in which a bit line is provided in a position higher than the memory capacitor MC.

The other members in FIG. 9 are the same as the members shown in FIG. 1A, and these members are denoted by the same reference numerals as in FIG. 1A.

According to this embodiment, the upper electrode 35a and the Cu interconnect 42 are electrically connected via the dummy lower electrode 33b, the dummy barrier metal 32b, the dummy cell plug 30b, the lower layer dummy cell plug 20c, the local interconnect 24 and the lower layer interconnect plug 20d. In addition, in this embodiment, it is also unnecessary to form a contact hole, which reaches the Pt film 35 (upper barrier metal 36) constituting the upper electrode 35a, in the third interlayer insulating film 41. Thus, an effect of preventing deterioration of characteristics of the capacitive insulating film 34a, an effect of making dedicated equipment for memory cell formation unnecessary, and the like, can be realized by this embodiment as in the first embodiment while employing the structure with a bit line arranged in an upper position.

Next, a manufacturing process of a memory cell of the semiconductor memory device in this embodiment will be described with reference to FIGS. 10A to 10C.

In a step shown in FIG. 10A, the following processing is performed. First, the isolating insulating film 11 surrounding the active region is formed in the p-type Si substrate 10, and the memory cell transistor consisting of the source region 12, the drain region 13, the gate insulating films 14, the gate electrodes 15 and the oxide film sidewalls 16 is formed in the active region. This forming step of the memory cell transistor is performed with well-known procedures using a well-known technique such as thermal oxidation, forming and patterning of a polysilicon film and ion implantation. At this point, in forming the gate electrode 15, the local interconnect 24 consisting of polysilicon is simultaneously formed on the isolating insulating film 11.

Next, a BPSG film is deposited on the memory cell transistor and, thereafter, annealing and planarization by CMP (chemical mechanical polishing) is applied to the BSPS film to form the first interlayer insulating film 18. Moreover, contact holes that pierce through the first interlayer insulating film 18 to reach the source region 12, the drain region 13 and two parts of the local interconnect 24, respectively, are formed. Next, n-type polysilicon films are formed in the contact holes and on the first interlayer insulating film 18 and, thereafter, planarization is applied to the n-type polysilicon films by CMP, whereby the polysilicon film is embedded in each contact hole to form the lower layer memory cell plug 20a, the bit line plug 20b, the lower layer dummy cell plug 20c and the lower layer interconnect plug 20d.

Next, a TiAlN film with a thickness of approximately 30 nm and a Pt film with a thickness of approximately 50 nm are subsequently deposited on the first interlayer insulating film 18. Then, the TiAlN film and the Pt film are patterned, whereby the barrier metal 32a connected to the lower layer memory cell plug 20a and the lower electrode 33a consisting of Pt above the barrier metal 32a as well as the dummy barrier metal 32b connected to the lower layer dummy cell plug 20c and the dummy lower electrode 33b above the dummy barrier metal 32b are formed on the first interlayer insulating film 18. Here, when the Pt film is patterned, etching is applied to the TiAlN film forming a base in conditions with which a high selective ratio is realized. When the TiAlN film is patterned, etching is applied to the upper layer memory cell plug 30a consisting of W forming a base in conditions with a high selective ratio such that the upper layer memory cell plug 30a does not sink.

Next, a BST film ((BaSr)TiO$_3$ film) with a thickness of approximately 30 nm covering the first interlayer insulating film 18, the lower electrode 33a and the dummy lower electrode 33b is formed and, thereafter, the BST film is patterned such that the dummy lower electrode 33b is exposed to form the BST film 34 that becomes the capacitive insulating film 34a covering the lower electrode 33a.

Subsequently, a Pt film with a thickness of approximately 50 nm, a TiAlN film with a thickness of approximately 6 nm and an SiO$_2$ film are sequentially deposited on the BST film 34 and the dummy lower electrode 33b. Then, the SiO$_2$ film is patterned to form a hard mask 37 and, thereafter, the TiAlN film and the Pt film are sequentially patterned by dry etching using the hard mask 37 to form the upper barrier metal 36 covering the effective memory cell region Rec and the dummy cell region Rdc and the Pt film 35 including the upper electrode 35a and the extension of upper electrode 35b. At this point, a part positioned above the bit line plug 20b in the hard mask 37 is also removed, and an opening 59 is formed in the part.

Next, in a step shown in FIG. 10B, the second interlayer insulating film 22 is deposited and, thereafter, planarization of the second interlayer insulating film 22 is performed by CMP until the hard mask 37 is exposed. Then, a contact hole 60 piercing through the hard mask 37 to reach the bit line plug 20b is formed. At this point, the contact hole 60 is formed sufficiently smaller than an inside diameter of the opening 59 formed in the step shown in FIG. 10A, whereby an insulator film 52 is formed on the side of the contact hole 60.

Next, in a step shown in FIG. 10C, a trench piercing through the second interlayer insulating film 22 to reach the lower layer interconnect plug 20d is formed. Then, deposition and CMP of Cu film are performed to embed the Cu film in the contact hole 60 and the trench on the lower layer interconnect plug 20d, whereby the upper layer bit line plug 51 and the Cu interconnect 42 are formed.

Thereafter, the bit line 53 is formed by deposition and planarization of the third interlayer insulating film 41, formation of the contact hole and the trench in the third interlayer insulating film 41, and embedding of the Cu film in the contact holes and the trench (dual damascene method). Consequently, the structure of the memory cell shown in FIG. 9 is obtained.

According to the manufacturing method in this embodiment, since the step of forming a contact hole reaching the upper surface of the Pt film 35 (upper barrier metal 36) forming the upper electrode 35a, in the hard mask 37 can be avoided, deterioration of characteristics of the capacitive insulating film 34a due to exposure to the reducing atmosphere can be surely inhibited in the same manner as the manufacturing method in the first embodiment.

In addition, since the bit line is arranged in a position higher than the memory capacitor in this embodiment, in the embedded-DRAM process for combining, it is unnecessary to form the bit line in a separate step compared with the structure in which the bit line is arranged in a position lower than the memory capacitor, and manufacturing becomes easy. Thus, the semiconductor memory device of this embodiment is also advantageous in terms of costs.

Further, although the upper electrode 35a and the lower electrode 33a are formed of Pt and the upper barrier metal 36 is formed of TiAlN in this embodiment, these members may be formed of other conductive materials having oxidation resistance. In addition, although the capacitive insulating film 34a is formed of BST in this embodiment, it may be formed of other high dielectric materials. In particular, in the case of a dielectric film having the perovskite structure represented by a constitutional formula ABO$_3$, since oxygen atoms tend to be lost by reduction, a significant effect is realized by applying the present invention.

In addition, it is needless to mention that the present invention is not limited to a embedded device such as this embodiment but can be also applied to a semiconductor memory device having a capacitor using a general-purpose DRAM or a metal electrode such as an FeRAM.

Embodiment 8

Figure 11:
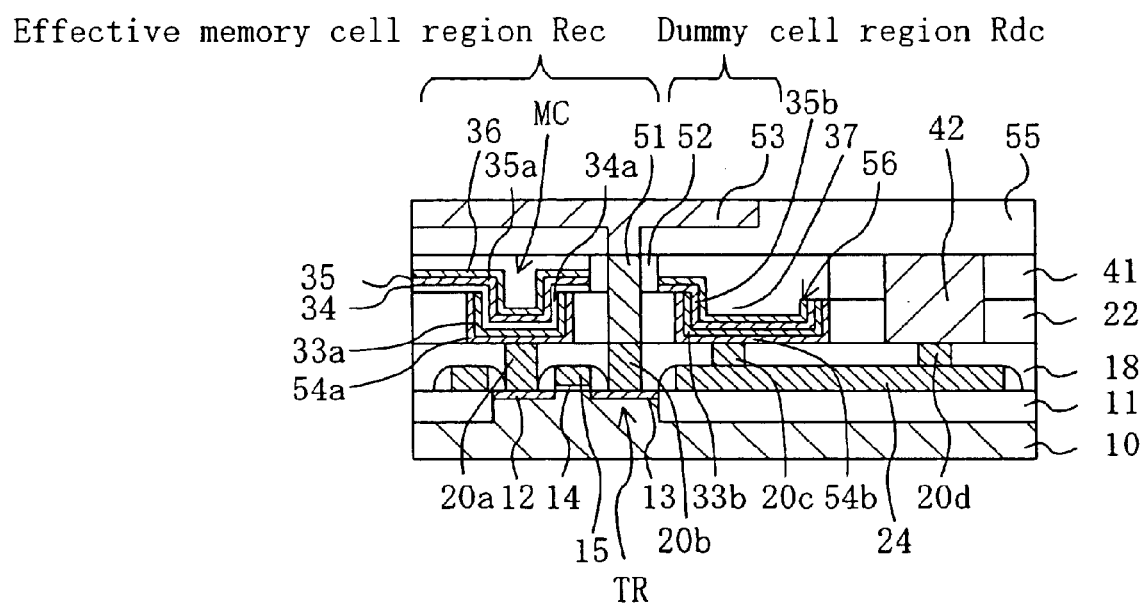
FIG. 11 is a sectional view showing a structure of a part of a memory portion of a semiconductor memory device in an eighth embodiment of the present invention.
Figure 12A:
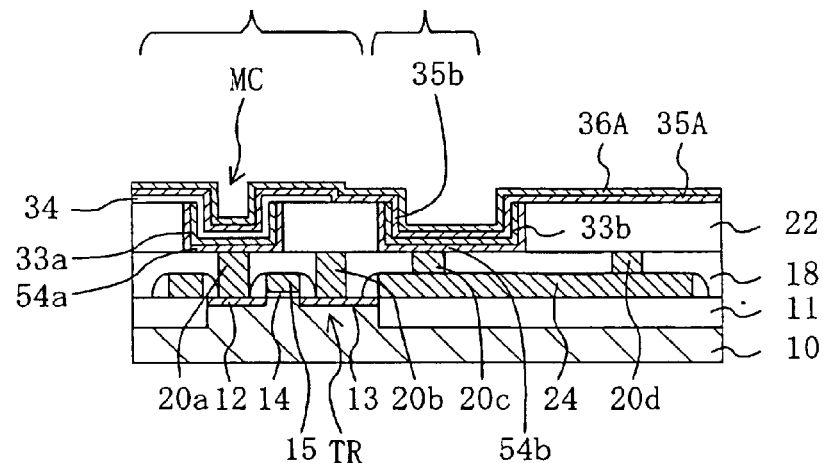
FIGS. 12A to 12C are step sectional views showing a manufacturing process of the semiconductor memory device in the eighth embodiment of the present invention.
Figure 12B:
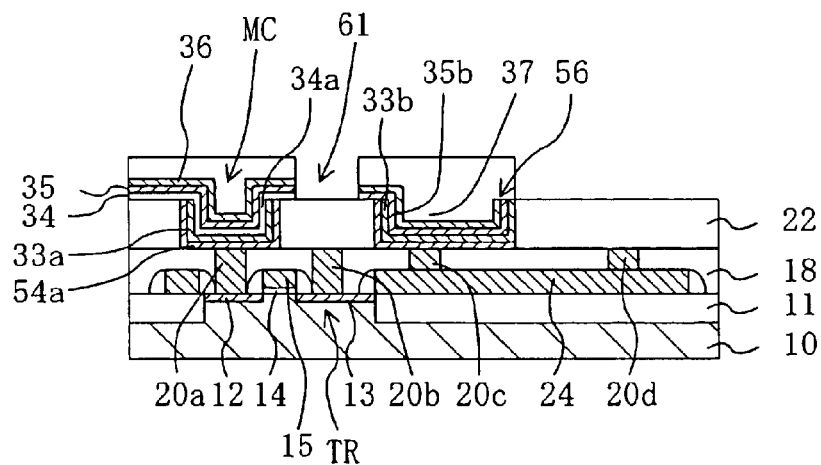
Figure 12C:
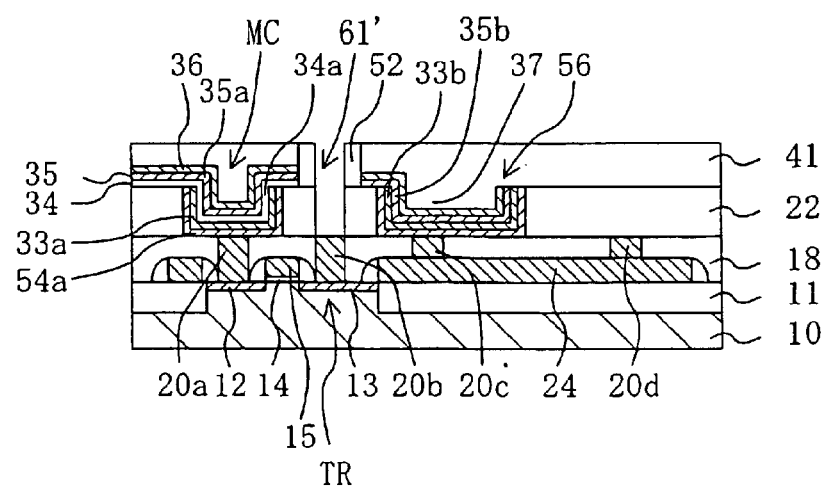

In this embodiment, an example in which the present invention is applied to a DRAM memory cell structure with a bit line arranged in an upper position, in which a bit line is arranged in a position higher than a memory capacitor, will be described as in the seventh embodiment. FIG. 11 is a sectional view showing a structure of a part of a memory portion in a semiconductor memory device in the eighth embodiment. FIGS. 12A to 12C are sectional views showing a manufacturing process of the semiconductor memory device in the eighth embodiment. The structure of the semiconductor memory device in this embodiment and the method for fabricating the semiconductor memory device will be hereinafter described in order. Here, although only the structure of the memory portion is shown in each figure of this embodiment, the semiconductor memory device of this embodiment is an embedded device in which a logic circuit element is provided in a not-shown logic circuit portion as in the first embodiment. However, a structure itself of the logic circuit element is not shown in the figures because it is not directly related to the essence of the present invention.

As shown in FIG. 11, in the memory portion of this embodiment, as in the fifth embodiment, the local interconnect 24 consisting of polysilicon is provided on the isolating insulating film 11 instead of the local interconnect 21b consisting of a W/Ti film in the first embodiment and, moreover, the lower layer dummy cell plug 20c piercing through the first interlayer insulating film 18 to come into contact with the local interconnect 24 and the lower layer interconnect plug 20d piercing through the first interlayer insulating film 18 to come into contact with the local interconnect 24 are provided.

In addition, a lower barrier metal 54a consisting of TiAlN and the lower electrode 33a are provided on the entire surface from a bottom to a side of one opening in the figure provided in the second interlayer insulating film 22. On the other hand, in a part of another opening provided in the second interlayer insulating film 22, a dummy lower barrier metal 54b consisting of TiAlN and the dummy lower electrode 33b are provided over the side to the bottom of the opening. In addition, the BST film 34 is provided on the lower electrode 33a, and the Pt film 35 and the upper barrier metal 36 are provided on the BST film 34 and on the dummy lower electrode 33b, respectively. A part of the BST film 34 in contact with the lower electrode 33a is the capacitive insulating film 34a, a part of the Pt film 35 opposed to the lower electrode 33a is the upper electrode 35a, and a part of the Pt film 35 in contact with the dummy lower electrode 33b is the extension of upper electrode 35b. That is, a clyndrical memory capacitor MC and dummy cell are provided across the first interlayer insulating film 18 to the second interlayer insulating film 22. The dummy lower electrode 33b (dummy lower barrier metal 54b) and the Cu interconnect 42 are directly connected to the lower layer dummy cell plug 20c and the lower layer interconnect plug 20d, respectively. The local interconnect 24 is formed of the same polysilicon film as the gate electrode 15. Further, a plane shape of the clyndrical memory capacitor MC may be any of circle, square or other polygons.

Moreover, on the bit line plug 20b, the upper layer bit line plug 51 piercing through the second interlayer insulating film 22 and the third interlayer insulating film 41 to reach the bit line plug 20b, the insulator film 52 covering the sides of the upper layer bit line plug 51 and the bit line 53 consisting of a Cu film embedded in the third interlayer insulating film 41 are provided. That is, the memory portion is provided with a structure of the DRAM memory cell with a bit line arranged in an upper position, in which a bit line is provided in a portion higher than the memory capacitor MC.

The other members in FIG. 11 are the same as the members shown in FIG. 1A, and these members are denoted by the same reference numerals as in FIG. 1A.

According to this embodiment, the upper electrode 35a and the Cu interconnect 42 are electrically connected via the dummy lower electrode 33b, the dummy lower barrier metal 54b, the lower layer dummy cell plug 20c, the local interconnect 24 and the lower layer interconnect plug 20d. In addition, in this embodiment, it is also unnecessary to form a contact hole, which reaches the Pt film 35 (upper barrier metal 36) constituting the upper electrode 35a, in the third interlayer insulating film 41. Thus, an effect of preventing deterioration of characteristics of the capacitive insulating film 34a, an effect of making dedicated equipment for memory cell formation unnecessary, and the like, can be realized by this embodiment as in the first embodiment while employing the structure with a bit line arranged in an upper position.

Next, a manufacturing process of a memory cell of the semiconductor memory device in this embodiment will be described with reference to FIGS. 12A to 12C.

In a step shown in FIG. 12A, the following processing is performed. First, the isolating insulating film 11 surrounding the active region is formed in the p-type Si substrate 10, and the memory cell transistor consisting of the source region 12, the drain region 13, the gate insulating films 14, the gate electrodes 15 and the oxide film sidewalls 16 is formed in the active region. This forming step of the memory cell transistor is performed with well-known procedures using a well-known technique such as thermal oxidation, forming and patterning of a polysilicon film and ion implantation. At this point, in forming the gate electrode 15, the local interconnect 24 consisting of polysilicon is simultaneously formed on the isolating insulating film 11.

Next, a BPSG film is deposited on the memory cell transistor and, thereafter, annealing and planarization by CMP (chemical mechanical polishing) is applied to the BSPS film to form the first interlayer insulating film 18. Moreover, contact holes that pierce through the first interlayer insulating film 18 to reach the source region 12, the drain region 13 and two parts of the local interconnect 24, respectively, are formed. Next, n-type polysilicon films are formed in the contact holes and on the first interlayer insulating film 18 and, thereafter, planarization is applied to the n-type polysilicon films by CMP, whereby the polysilicon film is embedded in each contact hole.

Next, an NSG film is deposited on the first interlayer insulating film 18 and, thereafter, planarization by CMP is applied to the NSG film to form the second interlayer insulating film 22. Then, openings for exposing the lower layer memory cell plug 20a and the dummy cell plug 20c are formed in the second interlayer insulating film 22 in two parts in the figure.

Next, a TiAlN film with a thickness of approximately 6 nm and a Pt film with a thickness of approximately 30 nm are deposited on the substrate and, thereafter, CMP is performed until the upper surface of the second interlayer insulating film 22 is exposed, whereby the lower barrier metal 54a and the lower electrode 33a as well as the lower dummy barrier metal 54b and the dummy lower electrode 33b are formed leaving the TiAlN film and the Pt film on the bottoms and the sides of the openings in two parts in the figure. Next, a BST film ((BaSr)TiO$_3$ film) with a thickness of approximately 30 nm is deposited on the substrate and, thereafter, a part of a dummy cell region is removed by etching to form the BST film 34 including the capacitive insulating film 34a. Subsequently, a Pt film 35A with a thickness of approximately 30 nm and a TiAlN film 36A with a thickness of approximately 6 nm that cover the BST film 34, the second interlayer insulating film 22 and the dummy lower electrode 33b are sequentially deposited.

Next, in a step shown in FIG. 12B, the hard mask 37, in which the effective memory cell region Rec and the dummy cell region Rdc are covered and the other regions are opened, is formed. At this point, the hard mask 37 has an opening 61 in a region positioned above the lower layer bit line plug 20b. Thereafter, the TiAlN film and the Pt film are sequentially patterned by etching using the hard mask 37 as an etching mask to form the upper barrier metal 36 covering the effective memory cell region Rec and the dummy cell region Rdc and the Pt film 35 including the upper electrode 35a and the extension of upper electrode 35b. At this point, in the regions other than the effective memory cell region Rec and the dummy cell region Rdc, the TiAlN film and the Pt film are removed.

Next, in a step shown in FIG. 12C, the third interlayer insulating film 41 is deposited and, thereafter, planarization of the third interlayer insulating film 41 is performed by CMP. At this point, the opening 61 is temporarily embedded in the insulator.

Subsequently, an opening 61' piercing through the third interlayer insulating film 41 and the second interlayer insulating film 22 to reach the bit line plug 20b is opened by anisotropic etching. At this point, the inside diameter of the opening 61' is set sufficiently smaller than the opening 61, whereby the insulator film 52 is formed on the side of the opening 61'.

Next, although not shown in the figure, contact holes piercing through the third interlayer insulating film 41 and the second interlayer insulating film 22 to reach the lower layer interconnect plug 20d are formed. Then, deposition and CMP of a Cu film is performed to embed the Cu film in each contact hole, whereby the upper layer bit line plug 51 and the Cu interconnect 42 are formed.

Thereafter, the bit line 53 is formed by deposition and planarization of a fifth interlayer insulating film 55, formation of the contact holes and the trench in the fifth interlayer insulating film 55, and embedding of the Cu film in the contact holes and the trench (dual damascene method). Consequently, the structure of the memory cell shown in FIG. 11 is obtained.

According to the manufacturing method in this embodiment, since the step of forming a contact hole, which reaches the upper surface of the Pt film 35 (upper barrier metal 36) forming the upper electrode 35a, in the third interlayer insulating film 41 can be avoided, deterioration of characteristics of the capacitive insulating film 34a due to exposure to the reducing atmosphere can be surely inhibited in the same manner as the manufacturing method in the first embodiment.

In addition, since the memory capacitor MC has a clyndrical structure, a capacity for a unit area of the substrate increases. Therefore, a DRAM in which memory cells are arranged at high density can be realized.

Further, although the upper electrode 35a and the lower electrode 33a are formed of Pt and the upper barrier metal 36 is formed of TiAlN in this embodiment, these members may be formed of other conductive materials having oxidation resistance. In addition, although the capacitive insulating film 34a is formed of BST in this embodiment, it may be formed of other high dielectric materials. In particular, in the case of a dielectric film having the perovskite structure represented by a constitutional formula $ABO_3$, since oxygen atoms tend to be lost by reduction, a significant effect is realized by applying the present invention.

In addition, it is needless to mention that the present invention is not limited to a embedded device such as this embodiment but can be also applied to a semiconductor memory device having a capacitor using a general-purpose DRAM or a metal electrode such as an FeRAM.

Further, although the example in which the structure of the clyndrical memory capacitor is applied to the memory cell with a bit line arranged in an upper position is described in this embodiment, it is also possible to apply the clyndrical structure of the memory capacitor shown in FIG. 11 to a memory cell with a capacitor over bit line.

Other Embodiments

A polysilicon film functioning as gate interconnect is used as local interconnect in the seventh and eighth embodiments. However, the same structure as the fourth and sixth embodiments can also be employed in a DRAM memory cell having the structure with a bit line arranged in an upper position as in the seventh and eighth embodiments. That is, in the DRAM memory cell having the structure with a bit line arranged in an upper position, the local interconnect 23 consisting of an embedded W film shown in FIG. 6 and the local interconnect 25 consisting of doped layers shown in FIG. 8 may be provided.

In addition, the DRAM memory cell has a structure in which a dummy lower electrode is in direct contact with the Cu interconnect.

The example in which the present invention is applied to the embedded semiconductor memory device provided with a DRAM and a logic circuit is shown in each of the embodiments. However, the present invention is not limited to such embodiments but can be applied to a general-purpose DRAM.

In addition, the present invention can be applied to a semiconductor memory device using a ferroelectric film such as an FeRAM as a capacitive insulating film. In this case, the semiconductor memory device may be either a general-purpose memory type or a memory logic embedded type.

Further, although the hard mask is formed on the upper electrode in the embodiments, a regist mask may be formed instead of the hard mask depending on a type of a conductive material of the upper electrode or a lower electrode. However, since collapse of a mask pattern at the time of etching can be inhibited by using the hard mask, a patterning accuracy can be improved.

Moreover, although the dummy lower electrode is provided in the first, second, fourth to eighth embodiments of the present invention, it may not always be provided. Therefore, the dummy conductor member connecting the upper electrode and the Cu interconnect includes at least one of the dummy lower electrode, the dummy cell plug and the local interconnect.

What is claimed is:

1. A semiconductor memory device, comprising:
    a memory capacitor that is provided on an insulating layer over a semiconductor substrate and includes by a lower electrode, an upper electrode and a capacitive insulating film interposed between the lower electrode and the upper electrode;
    an extension of the upper electrode from the upper electrode of the memory capacitor,
    a dummy conductor member provided such that a part of the dummy conductor member is in contact with an underside of the extension of upper electrode; and
    upper layer interconnect electrically connected to the dummy conductor member.

2. The semiconductor memory device according to claim 1,
    wherein the dummy conductor member includes a dummy lower electrode formed of the same conductor film as the lower electrode.

3. The semiconductor memory device according to claim 1,
    wherein the dummy conductor member further includes conductor film filling a trench provided in the insulating layer.

4. The semiconductor memory device according to claim 1,
wherein the dummy conductor member further includes local interconnect provided on the semiconductor substrate under the insulating layer; and a plug piercing through the insulating layer to electrically connect the extension of upper electrode and the local interconnect.

5. The semiconductor memory device according to claim 4, further comprising a bit line formed below the memory capacitor across the insulating layer,
wherein the local interconnect is formed of the same conductor film as the bit line.

6. The semiconductor memory device according to claim 4,
wherein at least a part of the extension of upper electrode overlaps the conductor plug when it is viewed two-dimensionally.

7. The semiconductor memory device according to claim 1, further comprising:
an isolating insulating film provided in a semiconductor substrate below the insulating layer;
a memory cell transistor formed in a region of the semiconductor substrate, the memory cell transistor including a gate electrode and doped layers defined within the semiconductor substrate below the gate electrode to horizontally sandwich the gate electrode there between;
local interconnect that is provided on the isolating insulating film and is formed of the same conductor film as the gate electrode; and
a conductor plug piercing through the insulating layer to connect the local interconnect.

8. The semiconductor memory device according to claim 1, further comprising:
a memory cell transistor that is provided on the semiconductor substrate and has a gate electrode and doped layers defined within the semiconductor substrate below the gate electrode to horizontally sandwich the gate electrode there between;
local interconnect formed of another doped layer that is provided spaced apart from the doped layers on the semiconductor substrate; and
a conductor plug piercing through the insulating layer to be connected to the local interconnect.

9. The semiconductor memory device according to claim 2,
wherein the upper layer interconnect is in contact with the dummy lower electrode.

10. The semiconductor memory device according to claim 1,
wherein the memory capacitor has a clyndrical lower electrode, a capacitive insulating film and an upper electrode.

11. The semiconductor memory device according to claim 1,
wherein the capacitive insulating film is a high-κ film or a ferroelectric film.

* * * * *